United States Patent
Wen et al.

Patent Number: 5,296,720
Date of Patent: Mar. 22, 1994

[54] APPARATUS AND METHOD FOR DISCRIMINATING AGAINST UNDESIRED RADIATION IN A MULTIPLE QUANTUM WELL LONG WAVELENGTH INFRARED DETECTOR

[75] Inventors: Cheng P. Wen, Mission Viejo; Chan-Shin Wu, Torrance, both of Calif.

[73] Assignee: Hughes Aircraft Company, Los Angeles, Calif.

[21] Appl. No.: 792,535

[22] Filed: Nov. 17, 1991

[51] Int. Cl.⁵ .................. H01L 27/14; H01L 31/00
[52] U.S. Cl. ................................. 257/21; 257/15; 257/184
[58] Field of Search .............. 257/21, 15, 17, 20, 257/24, 26, 184, 185, 186, 189; 250/330, 332

[56] References Cited

U.S. PATENT DOCUMENTS

| | | | |
|---|---|---|---|
| 5,031,013 | 7/1991 | Choi | 257/21 |
| 5,121,181 | 6/1992 | Smith, III et al. | 257/21 |
| 5,126,552 | 6/1992 | Hayes, Jr. | 250/332 |
| 5,155,362 | 10/1992 | Baker | 257/227 |

*Primary Examiner*—Sara W. Crane
*Attorney, Agent, or Firm*—William C. Schubert; Wanda K. Denson-Low

[57] ABSTRACT

A multiple quantum well (MQW) radiation sensor distinguishes radiation within a desired bandwidth, particularly long wavelength infrared radiation (LWIR), from background high intensity noise radiation that excites majority-minority charge carrier pairs. A minority charge carrier collector is provided at one end of the MQW, and the flow of minority charge carriers to the collector is sensed. The minority charge carrier flow provides an indication of the majority charge carrier flow that is attributable to the noise radiation rather than to radiation within the desired bandwidth, and can thus be used to provide a corrected indication of the desired bandwidth radiation.

21 Claims, 2 Drawing Sheets

APPARATUS AND METHOD FOR DISCRIMINATING AGAINST UNDESIRED RADIATION IN A MULTIPLE QUANTUM WELL LONG WAVELENGTH INFRARED DETECTOR

BACKGROUND OF THE INVENTION

1. Field of the Invention

This invention relates to the detector of electromagnetic radiation with a multiple quantum well (MQW) super-lattice structure, and more particularly to the sensing of long wavelength infrared radiation (LWIR) in the presence of background radiation from intrinsic events.

2. Description of the Related Art

The detection of LWIR with an MQW sensor has been reported in several publications: Levine et al., "Bound-to-Extended State Absorption GaAs Superlattice Transport Infrared Detectors", *J. Applied Physics Letters* Vol. 64, No. 3, 1 Aug. 1988, pages 1591-1593; Levine et al., "Broad-band 8-12 $\mu$m High-Sensitivity GaAs Quantum Well Infrared Photodetector", *Applied Physics Letters* Vol. 54, No. 26, 26 June 1989, pages 2704-2706; Hasnain et al., "GaAs/AlGaAs Multiquantum Well Infrared Detector Arrays Using Etched Gratings", *Applied Physics Letters* Vol. 54, No. 25, 19 June 1989, pages 2515-2517; Levine et al., "High-Detectivity $D^* = 1.0 \times 10^{10}$cm $\sqrt{/W}$ GaAs/AlGaAs Multiquantum Well $\lambda = 8.3$ $\mu$m Infrared Detector", *Applied Physics Letters*, Vol. 53, No. 4, 25 July 1988, pages 296-298.

The detector consists of a periodic heterostructure of GaAs quantum wells and AlGaAs barrier layers. The GaAs quantum well layers are doped with an n-type dopant such as silicon to provide electrons in the ground states of the wells for intersubband detection. Lacking an internal built-in electric field, the device operates as a photoconductive sensor. Under the influence of a bias voltage applied across n-doped contact layers at opposite ends of the MQW structure, electrons excited into a conduction band above the barrier heights flow through the device for collection at one of the contact layers. This majority current flow is sensed by an external ammeter and provides an indication of the amount of LWIR that is incident upon the device.

An improvement upon this detector is disclosed in pending U.S. patent application Ser. No. 07/457,613 filed Dec. 27, 1989 by Sato et al., "Dark Current-Free Multi-quantum Well Superlattice Infrared Detector", and assigned to Hughes Aircraft Company, the assignee of the present invention. In this improvement a blocking layer of barrier material is provided between the MQW superlattice and the collector contact. The blocking layer is substantially thicker than the barrier layers, thus eliminating most of the tunneling current component of the photodetector's dark current. This in turn allows the individual blocking layers to be made thinner, thus enhancing the detector's quantum efficiency.

Although the Sato et al. device improves upon the other detectors referenced above, all of these devices suffer from the presence of background noise signals caused by incident high energy photons or particles (collectively referred to hereinafter as radiation) from intrinsic events such as laser light, nuclear explosions and cosmic rays. Such intrinsic event radiation adds to the total majority carrier flow in the detector, resulting in spurious signals that can severely hamper the operation of the detector array, particularly in space-borne environments.

SUMMARY OF THE INVENTION

The present invention seeks to discriminate against spurious signals caused by undesired incident high energy radiation in an MQW radiation detector, particularly for LWIR, and thereby significantly improve the signal-to-noise ratio. The invention further seeks to accomplish this goal without adding significantly to the structural or fabrication complexity of the device, or to its cost.

An MQW superlattice sensor is combined with either a p-n junction or a metal-semiconductor Schottky junction at the majority charge carrier emitter end of the device. The high energy undesired radiation excites both majority and minority charge carriers into respective conduction bands. A flow of the excited minority charge carriers is established across the p-n or Schottky junction to a minority charge carrier collection region with an appropriate quantum energy spectrum for collecting minority charge carriers. The flow of minority charge carriers can be increased, if desired, by the use of a separate bias voltage. The minority charge carrier flow is measured separately from the majority charge carrier flow, thereby providing an indication of the total majority charge carrier flow that is attributable to the undesired radiation.

A majority charge carrier emitter layer between the MQW and the minority charge carrier collection region is substantially thinner than the mean-free path length of the minority charge carriers, thus allowing most of those carriers to flow through the majority carrier emitter and into the minority carrier collection region. For a GaAs/AlGaAs device, the minority charge carrier collection layer is preferably about 1,500-3,000 Angstroms thick. When implemented as a semiconductor, the minority charge carrier collection layer is doped to the opposite polarity of the quantum wells.

These and other features and advantages of the invention will be apparent to those skilled in the art from the following detailed description, taken together with the accompanying drawings, in which:

DETAILED DESCRIPTION OF THE INVENTION

Figure 1:
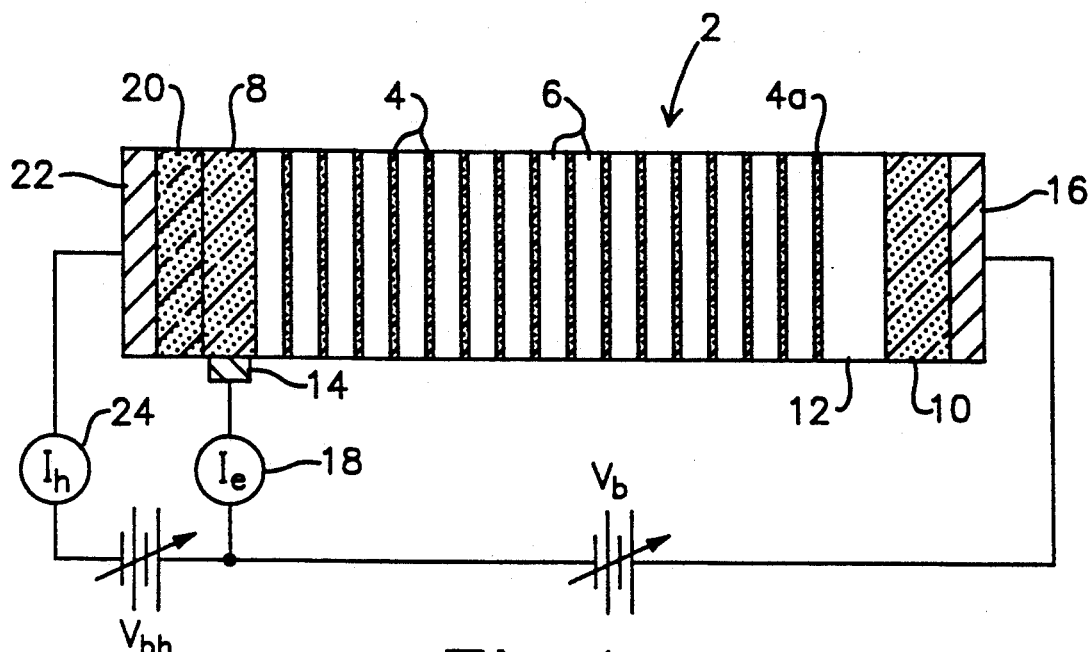
FIG. 1 is an enlarged sectional view of a radiation sensor in accordance with the invention, not to scale.

A radiation sensor in accordance with the invention, intended particularly for sensing LWIR, is shown in FIG. 1. The device is typically fabricated on a substrate (not shown) that is transparent to incident radiation of the wavelength to be detected. Due in part to superior lattice matching, the preferred materials for the radiation sensor are gallium arsenide (GaAs) and aluminum gallium arsenide (AlGaAs), most preferably $Al_xGa_{1-x}As$ where x is typically between 0.2 and 0.3. Accordingly, the substrate is preferably semi-insulating GaAs.

The various semiconductor layers of the radiation sensor are epitaxial layers that are preferably formed either by molecular beam epitaxy or by metal organic chemical vapor deposition. The sensor includes a superlattice 2 that comprises multiple heterostructure layers of semiconductor materials having alternating conductivities. Specifically, superlattice 2 includes a plurality of quantum well layers 4 interleaved with a plurality of barrier layers 6. The quantum well layers 4 are preferably n-doped GaAs, while the barrier layers 6 are preferably intrinsic (undoped) AlGaAs. The thickness of each quantum well layer 4 is sufficiently small, preferably about 20–60 Angstroms and most preferably about 40 Angstroms, that quantum effects are significant. The thickness of each barrier layer 6 is preferably about 40–300 Angstroms, and most preferably about 140 Angstroms. The period of the superlattice 2 is thus preferably about 180 Angstroms.

The superlattice is sandwiched between a pair of heavily n-doped GaAs contact layers 8 and 10, with contact layer 8 functioning as an electron emitter and contact layer 10 as an electron collector during sensor operation. To maximize the device's quantum efficiency, it is desirable to provide many quantum well layers 4. Photon absorption occurs in the quantum well layers, and quantum efficiency is thus a function of the number of such layers. Although a smaller number of periods are shown in FIG. 1, it is generally preferred that superlattice 2 comprise about 10–30 periods. GaAs quantum well layers 4 are heavily doped n-type with a donor impurity such as Ge, S, Si, Sn, Te or Se. A particularly preferred dopant is Si at a concentration of about $1 \times 10^{18}$ to about $5 \times 10^{18} cm^{-3}$ preferably at the higher end of this range.

Although a GaAs/AlGaAs superlattice is preferred, other materials may also be used. For example, it may be desirable to use materials such as InGaAs/InAlAs on InP, SiGe on Si, and HgCdTe. In general, superlattices fabricated from III-V, IV-IV and II-VI semiconductor materials are suitable. Lattice match and thermal coefficient considerations, impurity concentrations and fabrication techniques are known in the art, and are not the subject of the present invention. Although the invention is particularly suited for the detection of LWIR, the sensor in general is applicable to the detection of radiation in other wavelength regimes.

In accordance with the teachings of co-pending application Ser. No. 07/457,613, a blocking layer 12 is super-imposed between the outermost quantum well layer 4a and the contact layer 10. Blocking layer 12 is formed from a material that has a good lattice match with the adjacent quantum well layer 4a. It is preferably formed from the same material as barrier layers 6, and is at least twice as thick as each barrier layer. The preferred thickness is about 800–3,000 Angstroms, and most preferably about 2,000 Angstroms. The blocking layer 12 reduces dark current in the sensor because it is thick enough to prevent electrons within the quantum wells from tunneling through its potential energy barrier to reach collector layer 10. By blocking the tunneling current with a single blocking layer 12, a more efficient operation is achieved in less space than when tunneling is reduced by merely increasing the thickness of each barrier layer as proposed prior to the introduction of the blocking layer. While the use of a blocking layer 12 is the preferred implementation of the present invention, it is equally applicable to MQW radiation sensors without the blocking layer.

An electric field is established across the MQW by connecting a bias voltage source $V_b$, with a voltage that can range from a few millivolts to a few volts, across the well by means of ohmic contacts 14 and 16 at the electron emitter and electron collector contacts 8 and 10, respectively. LWIR incident upon the MQW superlattice excites electrons in the quantum well layers 4 from their bound states into excited states. The mean-free path of electrons in the excited state is sufficiently large that the electrons travel through the superlattice under the applied bias voltage to collector layer 10, producing a photocurrent. The photocurrent is measured with a suitable ammeter 18, with the current magnitude providing an indication of the amount of LWIR incident upon the MQW. Presently available ammeters can measure such currents down to about $10^{-11} - 10^{-12}$ amperes.

As described thus far, the radiation sensor is subject to serious inaccuracies in the measurement of LWIR if high energy radiation from intrinsic events, such as laser light, nuclear explosions or cosmic rays, is also present. Unlike LWIR which excites charge carriers of only a single polarity into a conduction band, with the polarity depending upon the MQW superlattice structure, high energy incident photons from intrinsic events are capable of generating electron-hole pairs across the energy bandgap. Electrons excited from the valence band of the superlattice by intrinsic incident radiation are indistinguishable from the electrons excited by LWIR, while the holes produced by the intrinsic radiation drift towards the n-doped electron emitter contact 8 and recombine with electrons there. Since the ammeter 18 measures electron current flow stemming from both LWIR and background radiation from intrinsic events, its readout will have a serious error when the background radiation level is high.

The invention effectively corrects for this error by sensing the flow of holes, and using the hole current to indicate the portion of the total sensed electron current that is due to intrinsic event radiation rather than to LWIR. For this purpose, a hole collector layer 20 is deposited in contact with the electron emitter contact 8 on the opposite side thereof from the MQW. The electron emitter contact 8 is made thin enough so that most of the holes flowing through the MQW will pass through the emitter contact and into the hole collector 20. For this purpose the electron emitter contact 8 is preferably about 1,500–3,000 Angstroms thick, which is less than the mean-free path for the holes. To measure the hole current, an ohmic contact 22 is established with the hole collector layer 20, and an ammeter 24 is connected between hole collector ohmic contact 22 and electron emitter ohmic contact 14 (conveniently through ammeter 18).

The hole collector layer 20 can be either a semiconductor doped to the opposite polarity of the electron emitter contact 8, thus establishing a p-n junction between the two layers, or a metallic layer that establishes a Schottky contact with the electron emitter layer. When n-doped GaAs is used for the electron emitter layer 8, p-doped GaAs is preferably used for the hole collector layer 20. With a doped semiconductor for the hole collector contact 20, it is the thickness of the undepleted portion of the electron emitter 8 that is critical in permitting a through-flow of holes, rather than the overall thickness of the entire layer. Holes generated in the MQW by the high energy background radiation are swept towards the p-doped hole collector layer 20 once they reach the depletion region of the p-n junction. In the absence of high energy background radiation, the hole current ammeter 24 reads the saturation current of the p-n junction. Any hole current in excess of the saturation current therefore indicates the presence of electron-hole pair generation by high energy incident radiation.

If desired, a separate bias voltage source $V_{bh}$ may be connected across hole collector ohmic contact 22 and electron emitter ohmic contact 14 to establish a reverse bias across the p-n junction (in the case of a doped semiconductor hole collector layer). This bias voltage can be set at any desired level, up to a few volts. All else being equal, it is generally preferable to leave this junction unbiased so that an extra power supply can be avoided. However, it may be desirable to use voltage source $V_{bh}$ if there is excessive hole recombination in the electron emitter layer 8.

Figure 2:
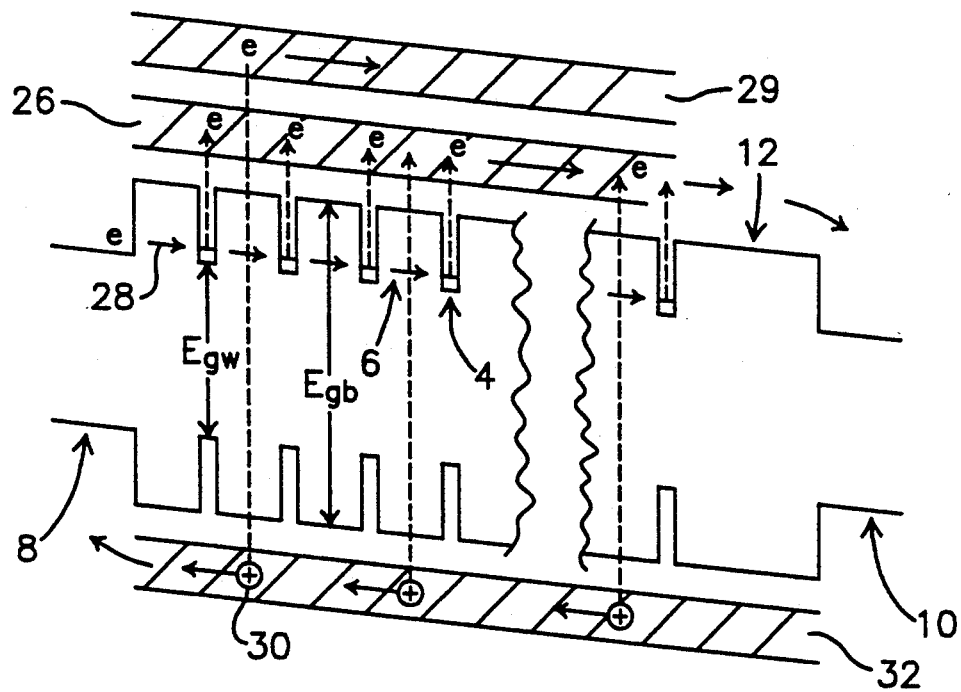
FIG. 2 is an energy diagram for a prior radiation sensor.

An energy diagram for the LWIR detector of FIG. 1, without the hole collector layer 20, is presented in FIG. 2. The energy bandgaps $E_{gw}$ and $E_{gb}$, respectively for the quantum wells and intermediate barriers, are indicated. The locations of the quantum wells, barrier layers, blocking layer and contacts are identified by the same reference numerals used in FIG. 1. For LWIR with peak detection of about 12 microns, the energy gap between the bound state and the excited state for electrons in the quantum wells is 100 meV, with the first electron excited state in the quantum wells lying above the conduction band edge of the barrier layer.

LWIR incident upon the superlattice excites majority charge carrier electrons in quantum well layers 4 from their bound states to extended excited states in continuous conduction subband 26, which has an energy level greater than the conduction band floor for barrier layer 6. The mean-free path of electrons in the subband 26 is sufficiently large that the electrons travel under the applied bias voltage through the superlattice to electron collector layer 10, producing a photocurrent that is measured as an indication of the LWIR magnitude. The tunneling electrons, indicated by arrows 28, that would otherwise reduce the signal-to-noise ratio are effectively eliminated by the blocking layer 12, which is too wide for electrons to tunnel through.

High energy background radiation from intrinsic events generates electron-hole pairs, with the electrons excited into a continuous conductive subband such as subbands 26 or 29, and minority charge carrier holes 30 excited into a continuous valence band 32 below the forbidden zone for both the quantum well and barrier layers. The holes flow in a direction opposite to the excited electron flow, entering the electron emitter contact area 8 where they recombine with the n-doped material therein.

Figure 3:
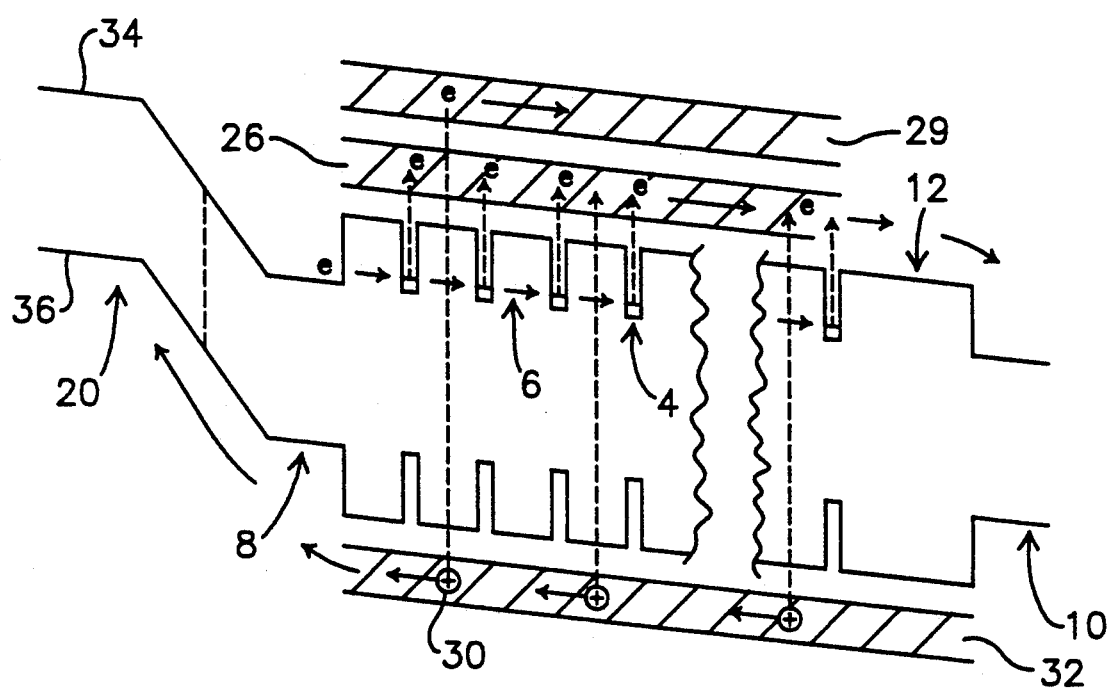
FIG. 3 is an energy diagram for radiation sensor in accordance with the invention.

An energy diagram for the improved sensor with a hole current detection capability is given in FIG. 3. It is similar to that of FIG. 2, but the p-doped hole collector layer 20 shifts the conduction and valence band edges 34 and 36, respectively, in this region compared to their energy levels in the MQW and n-doped electron emitter contact 8. While the conduction and valence band edges are seen as higher energy levels in the hole collector contact 20 for electrons, they are at lower energy levels with respect to the minority hole current. For holes the valance band serves as a conduction band.

Holes that are transmitted through the n-doped electron emitter layer 8 thus flow freely into the p-doped hole collector layer 20. This flow of minority charge carriers is sensed by ammeter 24 (FIG. 1). Since there is generally a 1:1 correspondence between electrons excited into continuous conduction bands such as 26, 29 by high energy background radiation intrinsic events, and holes excited into the valence band 32, the detected hole current can be taken as an indication of the amount of detected electron current that is attributable to the intrinsic event, rather than to LWIR. A more accurate reading of LWIR that greatly alleviates the effect of background high intensity radiation can thus be obtained.

While particular embodiments of the invention have been shown and described, numerous variations and alternate embodiments will occur to those skilled in the art. For example, while the invention has been described in terms of an MQW with n-doped quantum wells, it is also applicable to MQW sensors with p-doped quantum wells. With p-doped devices holes constitute the majority charge carriers and electrons are excited in response to an intrinsic event but not to LWIR. Excited electrons would thus be collected and monitored to provide an indication of the background non-LWIR. Furthermore, the principals of the invention are also applicable to MQWs that are sensitive to radiation outside the LWIR region. Accordingly, it is intended that the invention be limited only in terms of the appended claims.

We claim:

1. A sensor for electromagnetic radiation within a predetermined waveband, comprising:
   a multiple quantum well (MQW) structure, said radiation exciting majority charge carriers from said MQW structure into a conduction band, and undesired radiation outside of said predetermined waveband exciting both majority and minority charge carriers,
   means for obtaining a flow of said excited majority charge carriers as an indication of the total of the radiation within said predetermined waveband and said undesired radiation, and
   means for simultaneously obtaining a flow of said excited minority charge carriers as an indication of the portion of said majority charge carrier flow that is attributable to said undesired radiation.

2. The sensor of claim 1, said means for obtaining a flow of said majority charge carriers comprising majority charge carrier emitter and collector contact layers at opposite ends of said MQW structure, and said means for obtaining a flow of said minority charge carriers comprising a minority charge carrier collecting layer adjacent said majority charge carrier emitter layer for collecting minority charge carriers excited by said intrinsic event radiation.

3. The sensor of claim 2, wherein said majority charge carrier emitter layer is substantially thinner than the mean-free path length of said minority charge carriers.

4. The sensor of claim 3, wherein the thickness of said majority charge carrier emitter layer is about 1,500–3,000 Angstroms.

5. The sensor of claim 2, said MQW structure comprising a plurality of doped quantum well layers separated by barrier layers, said minority charge carrier collecting layer comprising semiconductor material doped to the opposite polarity of said quantum wells.

6. The sensor of claim 2, said minority charge carrier collecting layer comprising a metallic material establishing a Schottky contact with said majority charge carrier emitter layer.

7. A sensor for desired electromagnetic radiation within a predetermined waveband, comprising:

a multiple quantum well (MQW) structure with alternating barrier layers and doped quantum well layers, said desired electromagnetic radiation exciting majority charge carriers from said quantum wells into a conduction band, and undesired radiation outside of said predetermined waveband exciting both majority and minority charge carriers, majority charge carrier emitter and collector layers at opposite ends of said MQW structure having conduction band edge energies less than the barrier layer conduction band edge energies, and a minority charge carrier collecting layer contacting said majority charge carrier emitter layer on the opposite side of said emitter layer from said MQW structure, said minority charge carrier collecting layer having a conduction band edge energy for said minority charge carriers that is substantially less than the minority charge carrier conduction band edge energies of said barrier layers, whereby a flow of minority charge carriers excited by said undesired radiation into said minority charge carrier collecting layer is enabled, the magnitude of said minority charge carrier flow providing an indication of the portion of said excited majority charge carriers that are attributable to said undesired radiation.

8. The sensor of claim 7, wherein said majority charge carrier emitter layer is substantially thinner than the mean-free path length of said minority charge carriers.

9. The sensor of claim 8, wherein the thickness of said majority charge carrier emitter layer is about 1,500–3,000 Angstroms.

10. The sensor of claim 7, said minority charge carrier collecting layer comprising semiconductor material doped to the opposite polarity of said quantum wells.

11. The sensor of claim 7, said minority charge carrier collecting layer comprising a metallic material establishing a Schottky contact with said majority charge carrier emitter contact layer.

12. A long wavelength infrared (LWIR) sensing system, comprising:

a multiple quantum wall (MQW) structure comprising a plurality of doped quantum well layers separated by barrier layers, LWIR incident upon aid MQW structure exciting majority charge carriers of one polarity into a conduction band above the bandgap of said barrier layers, contact layers at the opposite ends of said MQW structure doped to the same polarity as said quantum well layers and functioning respectively as an emitter and a collector for said excited majority charge carriers, means for applying a first voltage bias across said contact layers to establish a flow of excited majority charge carriers, means for establishing a flow of minority charge carriers of opposite polarity to said majority charge carriers when said minority charge carriers are excited by undesired radiation other than LWIR that also excites majority charge carriers that add to said majority charge carriers flow, means for sensing the total majority charge carrier flow, and means, operating simultaneously with said means for sensing the total majority charge carrier flow, for sensing said flow of minority charge carriers as an indication of the component of the total sensed majority charge carrier flow that is attributable to said undesired radiation rather than to LWIR.

13. The LWIR sensing system of claim 12, said means for establishing a flow of minority charge carriers comprising a minority charge carrier collecting layer contacting said emitter contact layer.

14. The LWIR sensing system of claim 13, wherein said majority charge carrier emitter layer is substantially thinner than the mean-free path length of said minority charge carriers.

15. The LWIR sensing system of claim 14, wherein the thickness of said majority charge carrier emitter layer is about 1,500–3,000 Angstroms.

16. The LWIR sensing system of claim 13, said minority charge carrier collecting layer comprising semiconductor material doped to the opposite polarity of said quantum wells.

17. The LWIR sensing system of claim 13, said minority charge carrier collecting layer comprising a metallic material establishing a Schottky contact with said majority charge carrier emitter layer.

18. The LWIR sensing system of claim 13, said means for establishing a flow of minority charge carriers further comprising means for applying a second bias voltage across said majority charge carrier emitter and minority charge carrier collecting layers, said second bias voltage urging minority charge carriers across said majority charge carrier emitter contact layer to said minority charge carrier collecting layer.

19. A method of discriminating between radiation within a predetermined waveband and undesired radiation outside of said predetermined waveband that is incident upon a multiple quantum well (MQW) radiation sensor, said radiation within said predetermined waveband exciting majority charge carriers from the MQW into a conduction state and said undesired radiation exciting both majority and minority charge carriers from the MQW into respective conduction states, comprising:

inducing respective flows of said excited majority and excited minority charge carriers, sensing said flow of excited majority charge carriers, and simultaneously sensing said flow of excited minority charge carriers as an indication of the excited majority charge carrier flow that is attributable to said undesired radiation, rather than to radiation within said predetermined waveband.

20. The method of claim 19, wherein said flow of excited minority charge carriers is induced by collecting said excited minority charge carriers in a region lateral to said MQW having a conduction energy level for said minority charge carriers that is substantially less than the conduction band energy of said MQW for said minority charge carriers.

21. The method of claim 20, wherein said flow of excited minority charge carriers is further induced by applying a bias voltage that urges excited minority charge carriers from the MQW towards said minority charge carrier collecting region.

* * * * *